(12) United States Patent
Metz et al.

(10) Patent No.: US 7,226,831 B1
(45) Date of Patent: Jun. 5, 2007

(54) DEVICE WITH SCAVENGING SPACER LAYER

(75) Inventors: Matthew V. Metz, Hillsboro, OR (US); Mark L. Doczy, Beaverton, OR (US); Justin K. Brask, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/320,305

(22) Filed: Dec. 27, 2005

(51) Int. Cl.
*H01L 21/8238* (2006.01)

(52) U.S. Cl. .................... 438/216; 438/261; 438/287; 257/410; 257/295

(58) Field of Classification Search ................ 438/287, 438/294, 216, 261, 197, 591, 954, 981; 257/295, 257/410, 411, 412
See application file for complete search history.

(56) References Cited

U.S. PATENT DOCUMENTS

| | | | |
|---|---|---|---|
| 5,696,394 A * | 12/1997 | Jones et al. | 257/295 |
| 5,880,508 A * | 3/1999 | Wu | 257/411 |
| 6,063,698 A | 5/2000 | Tseng et al. | |
| 6,184,072 B1 | 2/2001 | Kaushik et al. | |
| 6,255,698 B1 | 7/2001 | Gardner et al. | |
| 6,348,709 B1 * | 2/2002 | Graettinger et al. | 257/311 |
| 6,365,450 B1 | 4/2002 | Kim | |
| 6,410,376 B1 | 6/2002 | Ng et al. | |
| 6,420,279 B1 | 7/2002 | Ono et al. | |
| 6,475,874 B2 | 11/2002 | Xiang et al. | |

(Continued)

FOREIGN PATENT DOCUMENTS

EP   0899784 A2   3/1999

(Continued)

OTHER PUBLICATIONS

J.H. Haeni et al., "Room-Temperature Ferroeclectricity in Strained $SrTiO_3$," Nature Publishing Group, vol. 430, Aug. 12, 2004, pp. 758-762.

(Continued)

*Primary Examiner*—Jerome Jackson
*Assistant Examiner*—Anthony Ho
(74) *Attorney, Agent, or Firm*—George Chen

(57) ABSTRACT

Embodiments of the invention provide a device with a metal gate, a high-k gate dielectric layer and reduced oxidation of a substrate beneath the high-k gate dielectric layer. An oxygen-scavenging spacer layer on side walls of the high-k gate dielectric layer and metal gate may reduce such oxidation during high temperature processes.

8 Claims, 7 Drawing Sheets

U.S. PATENT DOCUMENTS

| | | |
|---|---|---|
| 6,514,828 B2 | 2/2003 | Ahn et al. |
| 6,518,631 B1 * | 2/2003 | En et al. .................... 257/382 |
| 6,544,906 B2 | 4/2003 | Rotondaro et al. |
| 6,586,288 B2 | 7/2003 | Kim et al. |
| 6,617,209 B1 | 9/2003 | Chau et al. |
| 6,617,210 B1 | 9/2003 | Chau et al. |
| 6,620,713 B2 | 9/2003 | Arghavani et al. |
| 6,642,131 B2 | 11/2003 | Harada |
| 6,667,246 B2 | 12/2003 | Mitsuhashi et al. |
| 6,689,675 B1 | 2/2004 | Parker et al. |
| 6,696,327 B1 | 2/2004 | Brask et al. |
| 6,696,345 B2 | 2/2004 | Chau et al. |
| 6,709,911 B1 | 3/2004 | Doczy et al. |
| 6,713,358 B1 | 3/2004 | Chau et al. |
| 6,716,707 B1 | 4/2004 | Brask et al. |
| 6,727,130 B2 | 4/2004 | Kim et al. |
| 6,746,967 B2 | 6/2004 | Brask et al. |
| 6,770,568 B2 | 8/2004 | Brask et al. |
| 6,787,440 B2 | 9/2004 | Parker et al. |
| 6,794,234 B2 | 9/2004 | Polishchuk et al. |
| 6,806,146 B1 | 10/2004 | Brask et al. |
| 6,855,639 B1 | 2/2005 | Brask et al. |
| 6,858,483 B2 | 2/2005 | Doczy et al. |
| 6,867,102 B2 | 3/2005 | Brask et al. |
| 6,900,481 B2 * | 5/2005 | Jin et al. .................... 257/249 |
| 2002/0058374 A1 | 5/2002 | Kim et al. |
| 2002/0086504 A1 | 7/2002 | Park et al. |
| 2002/0197790 A1 | 12/2002 | Kizilyalli et al. |
| 2003/0032303 A1 | 2/2003 | Yu et al. |
| 2003/0045080 A1 | 3/2003 | Visokay et al. |
| 2003/0057432 A1 * | 3/2003 | Gardner et al. ............. 257/100 |
| 2003/0186508 A1 * | 10/2003 | Kim .......................... 438/303 |
| 2004/0033678 A1 * | 2/2004 | Arghavani et al. .......... 438/510 |

FOREIGN PATENT DOCUMENTS

GB             2358737 A      4/2001

OTHER PUBLICATIONS

Matthew V. Metz et al., U.S. Appl. No. 11/089,247, entitled "A Semiconductor Device With a High-K Gate Dielectric and a Metal Gate Electrode," filed Mar. 23, 2005.

Mark L. Doczy et al., U.S. Appl. No. 11/064,648, entitled "Method for Making a Semiconductor Device Having a High-K Gate Dielectric," filed Dec. 1, 2004.

Matthew V. Metz et al., U.S. Appl. No. 11/151,528, entitled "Semiconductor Device with a High-K Gate Dielectric and a Metal Gate Electrode," filed Jun. 13, 2005.

Justin K. Brask et al., U.S. Appl. No. 10/742,678, entitled "Method for Making a Semiconductor Device with a Metal Gate Electrode That is Formed on an Annealed High-K Gate Dielectric Layer," Dec. 19, 2003.

Justin K. Brask et al., U.S. Appl. No. 10/885,958, entitled "Method for Making a Semiconductor Device Having a High-K Gate Dielectric Layer and a Metal Gate Electrode," filed Jul. 6, 2004.

Robert B. Turkot Jr. et al., U.S. Appl. No. 10/939,227, entitled "Reducing Oxidation Under a High K Gate Dielectric," filed Sep. 10, 2004.

Brian S. Doyle et al., U.S. Appl. No. 11/158,621, entitled "Metal Gate Device with Reduced Oxidation of a High-K Gate Dielectric," filed Jun. 21, 2005.

* cited by examiner ent" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

DEVICE WITH SCAVENGING SPACER LAYER

BACKGROUND

Background of the Invention

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. When conventional processes are used to form such transistors, a silicon dioxide transition layer may form between the high-k dielectric and the substrate. This transition layer may grow larger during high temperature processes when available oxygen may react with the substrate to form more silicon dioxide. The presence of a thick transition layer may unfavorably contribute to the overall electrical thickness of the gate dielectric stack.

DETAILED DESCRIPTION

In various embodiments, an apparatus and method relating to the formation of a device with a scavenging spacer layer are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
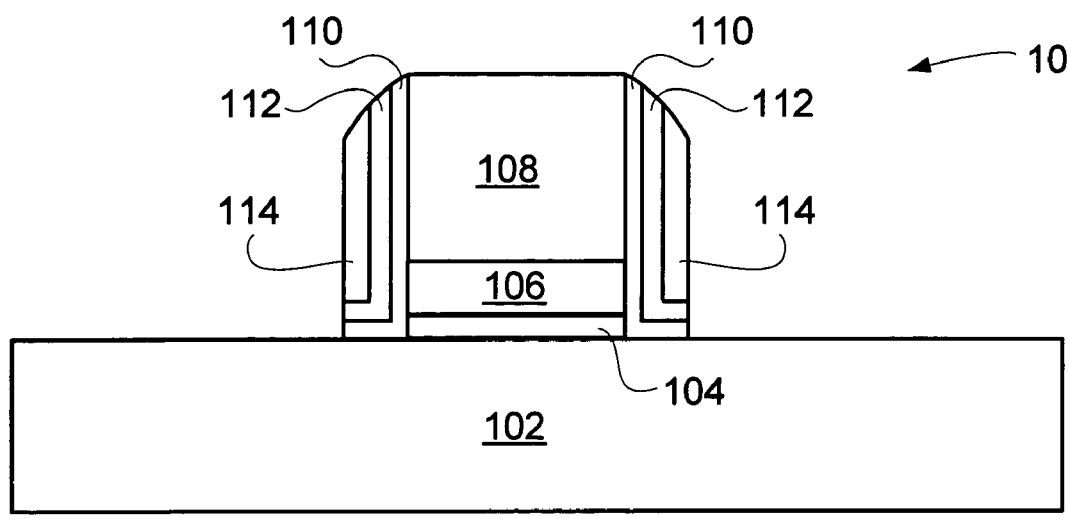
FIG. 1 is a cross sectional side view that illustrates the semiconductor device of one embodiment of the present invention.

FIG. 1 is a cross sectional side view that illustrates the semiconductor device 100 of one embodiment of the present invention. The device 100 may include a substrate 102. Substrate 102 may comprise any material that may serve as a foundation upon which a semiconductor device may be built. The substrate 102 may be a silicon containing substrate 102. The substrate 102 may be a bulk substrate 102, such as a wafer of single crystal silicon, a semiconductor-on-insulator (SOI) substrate 102, such as a layer of silicon on a layer of insulating material on another layer of silicon, or another type of substrate 102.

The device 100 may be a transistor in some embodiments. The device 100 may be a planar transistor on a bulk substrate 102, a planar transistor on an SOI substrate 102, a FIN-FET transistor on a bulk substrate 102, a FIN-FET transistor on an SOI substrate 102, a tri-gate transistor on a bulk substrate 102, a tri-gate transistor on an SOI substrate 102, or another type of transistor or another device.

In that semiconductor device 100, a high-k gate dielectric layer 106 may be formed on the substrate 102. The high-k gate dielectric layer 106 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Although a few examples of materials that may be used to form the high-k gate dielectric layer 106 are described here, the high-k gate dielectric layer 106 may be made from other materials that serve to reduce gate leakage in other embodiments.

The high-k gate dielectric layer 106 may have a k-value higher than about 7.5 in some embodiments. In other embodiments, the high-k gate dielectric layer 106 may have a k-value higher than about 10. In other embodiments, the high-k gate dielectric layer 106 may comprise a material such as $Al_2O_3$ with a k-value of about 12, or may comprise a material with a higher k-value than that. In other embodiments, the high-k gate dielectric layer 106 may have a k-value between about 15 and about 25, e.g. $HfO_2$. In yet other embodiments, the high-k gate dielectric layer 106 may have a k-value even higher, such as 35, 80 or even higher.

Between the high-k gate dielectric layer 106 and the substrate 102 may be a transition layer 104. This transition layer 104 may be a thin layer 104 of oxide, such as a thin layer 104 of silicon dioxide in embodiments where the substrate 102 comprises silicon, in some embodiments. If, during high temperature processes (such as processes performed at about 500 degrees Celsius or higher) oxygen is available to react with the substrate at the region of the transition layer 104, it may form an unwanted thicker oxide layer 104 beneath the high-k dielectric layer 106 and reduce the performance of the transistor.

Figure 2:
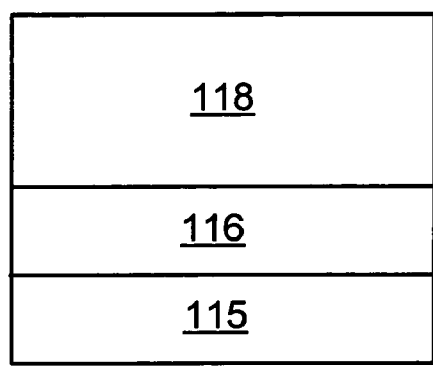
FIG. 2 is a cross sectional side view that illustrates the electrode in more detail.

An electrode 108 may be on the high-k gate dielectric layer 106. As seen in FIG. 2, the electrode 108 may include multiple layers. In the embodiment illustrated in FIG. 2, there is a work function layer 115, a cap layer 116 on the work function layer 115 and a polysilicon layer 118 on the cap layer 116. In other embodiments, the electrode 108 may include a different number of layers, and the layers may be different. The polysilicon layer 118 may comprise doped polysilicon in an embodiment. The polysilicon layer 118 may not be a polysilicon layer 118 in some embodiments, but instead comprise other non-polysilicon materials, or it may be absent. The cap layer 116 may comprise silicon in some embodiments, although it may comprise other materials in other embodiments. The work function layer 115 may comprise a metal work function layer 115.

The metal work function layer 115 may be an n-type metal gate electrode. Materials that may be used to form n-type metal gate electrodes include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten).

The metal work function layer 115 may be a p-type metal gate electrode. Materials for forming p-type metal gate electrodes include: ruthenium, palladium, platinum, cobalt, nickel, and conductive metal oxides, e.g., ruthenium oxide.

Rather than n- or p-type, the metal work function layer 115 may be a mid-gap metal gate electrode. In such embodiments, the work function layer 115 may comprise stoichiometric titanium nitride, tantalum nitride, or another mid-gap material.

The device 100 may be a transistor, such as an NMOS, PMOS, or mid-gap transistor. In some embodiments, metal work function layers 115 for NMOS transistor devices 100 may have a workfunction that is between about 3.9 eV and about 4.2 eV. In some embodiments, metal work function layers 115 for PMOS devices 100 may have a workfunction that is between about 4.9 eV and about 5.2 eV. In some embodiments, metal work function layers 115 for semiconductor on insulator (SOI) mid-gap transistor devices 100 may have a workfunction that is between the workfunctions of NMOS and PMOS gate electrode materials.

A metal work function layer 115 may consist essentially of a homogeneous metal layer. Alternatively, relatively thin n-type, p-type, or mid-gap metal layers (like those listed above) may generate the lower part of the metal work function layer 115, with the remainder of the metal work function layer 115 comprising another metal or metals, e.g., a metal that may be easily polished like tungsten, aluminum, titanium, or titanium nitride. Such a material may make up the remainder of the gate electrode 108, or additional layers, such as the cap layer 116 and polysilicon layer 118 illustrated in FIG. 3 may be part of the gate electrode 108 as well. Although a few examples of materials for forming a metal work function layer 115 are identified here, such a component may be made from many other materials, as will be apparent to those skilled in the art.

Returning to FIG. 1, there may be inner spacers 110 on side walls of the high-k dielectric layer 106 and electrode 108. The inner spacers 110 may comprise a layer of material that can be formed at a temperature below about 500 degrees Celsius. In various embodiments, the inner spacers 110 may comprise silicon nitride, aluminum nitride, silicon oxide, carbon doped silicon nitride, or another material. In some embodiments, the material of the inner spacers 110 has a high etch bias relative to other materials in the device 100. Some embodiments may lack the inner spacers 110.

There may be scavenger spacers 112 on side walls of the high-k dielectric layer 106 and electrode 108. The scavenger spacers 112 may comprise a material that is reactive with oxygen in embodiments where the scavenger spacers 112 are oxygen scavenger spacers 112. The scavenger spacers 112 may originally comprise a layer of oxidizable material such as a group III, IV or V metal (e.g., Hf, Zr, Ti, Ta), aluminum, a nitride of a group III, IV or V metal (e.g., HfN, ZrN, TiN, TaN or $Ta_3N_5$), a nitride of a group III, IV or V metal that is deficient in nitrogen (e.g., $Ti_1N_{1-x}$, or $Ta_3N_{5-x}$), a silicon nitride deficient in nitrogen (e.g., $Si_3N_{4-x}$), or another material. Deficient in nitride as used herein means the material is relatively rich in the non-nitrogen element.

Oxygen present may react with the scavenger spacers 112, which prevents the oxygen from reacting with other materials. For example, in an embodiment the scavenger spacers 112 may react with oxygen and thus reduce an oxide, such as silicon dioxide, forming from the reaction of the oxygen and the substrate 102. This may result in reduction in thickness of the transition layer 104; some oxygen that would react with the substrate 102 to form a thicker transition layer 104 may instead react with the scavenger spacers 112. In other words the scavenger spacers 112 may at least partially prevent oxidation of the substrate 102, which could result in the formation of undesired oxide, such as silicon oxide, beneath the high-k dielectric layer 106 and electrode 108. Such an undesired oxide could be of a thickness enough to degrade the performance of the device if its formation is not prevented.

There may be outer spacers 114 on side walls of the high-k dielectric layer 106 and electrode 108. The outer spacers 114 may be on side walls of the scavenger spacers 112. Outer spacers 114 may comprise a layer any material suitable for forming spacers, including materials that require high temperatures to form. Some embodiments may lack the outer spacers 114.

Figure 3:
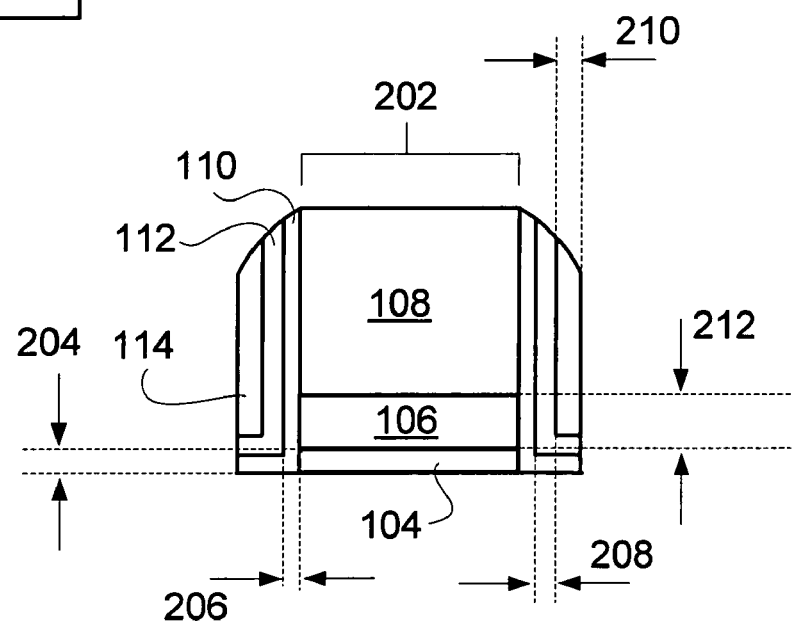
FIG. 3 is a cross sectional side view that illustrates the thicknesses and sizes of various parts of the device of FIG. 1.

FIG. 3 is a cross sectional side view that illustrates the thicknesses and sizes of various parts of the device 100 of FIG. 1, according to one embodiment. As shown in FIG. 3, there may be a length 202. In an embodiment where the device 100 is a transistor, the length 202 may be the length of the gate electrode 108, which is substantially the same as the length of the channel of the transistor. In an embodiment, the electrode 108 may have a length 202 of 30-35 nm. In other embodiments, the length 202 may be different.

The transition layer 104 may have a thickness 204. This transition layer 104 may be as thin as a monolayer of oxide in some embodiments at the time of formation of the scavenger spacer layer 112. In some embodiments, the thickness 204 may be as thin as about 3 angstroms or less at the time of formation of the scavenger spacer layer 112. In other embodiments, the transition layer 104 may have more than one layer of oxide and/or may be thicker than about 3 angstroms. In an embodiment, during high-temperature processes (above about 500 degrees Celsius), the thickness 204 may grow larger, but because of the presence of the scavenging material in the scavenger spacers 112, the thickness 204 may not grow as big as it would absent the scavenging material. In an embodiment, the thickness 204 of the transition layer 104 may remain about 3 angstroms in the completed device 100. In another embodiment, the transition layer 104 may have a thickness 204 between about 4 angstroms and about 8 angstroms in the completed device 100. Other embodiments may have a transition layer 104 with a different thickness 204 in the completed device 100.

The inner spacer layer 110 may also have a thickness 206. In an embodiment, the inner spacer layer 110, and thus the inner spacers 110, may have a thickness 206 between about 10 angstroms and about 100 angstroms, although the thickness 206 may be different in other embodiments.

The scavenging spacer layer 112 may have a thickness 208. In some embodiments, the thickness 208 may be between about 30 angstroms and about 50 angstroms, although the scavenging spacer layer 112 may have a different thickness 208 in other embodiments. In some embodiments, the thickness 208 may be chosen based at least in part on the fabrication of the device 100. For example, if higher temperatures are used or there is more ambient oxygen, the thickness 208 may be greater than if lower temperatures are used, or less ambient oxygen. In embodiments where the scavenging spacers 112 comprise a metal, the thickness 208 may be chosen so that the metal is substantially entirely oxidized by the completion of fabrication of the device, to prevent source-to-drain short circuits.

The outer spacers 114 may have a thickness 210. This thickness 210 may be any suitable thickness 210 to result in the sum of the thicknesses 206, 208, 210 being a desired thickness for the device's 100 spacers.

The high-k dielectric layer 106 may have a thickness 212. The thickness 212 may be selected to provide an acceptable level of leakage current in the device 100, and to provide a selected electrical thickness of the gate stack, in embodiments where the device 100 is a transistor. In some embodiments, the high-k gate dielectric layer 106 may be less than about 40 angstroms thick 212. The high-k dielectric layer 106 may have a thickness 212 less than about 25 angstroms. In other embodiments, the high-k gate dielectric layer 106 may be between about 5 angstroms and about 20 angstroms thick 212. The high-k dielectric layer 106 may have a different thickness 212 in other embodiments.

The electrode 108 and a work function layer 115 may have thicknesses (not shown). The thickness of the work function layer 115 may be chosen to provide a desired work function and threshold voltage ($V_{Th}$) of the gate of the device 100. In other embodiments, the thickness may be greater than about 75 angstroms. In yet other embodiments, the thickness may be different.

By avoiding a thick transition layer 104 through the use of a scavenging spacer layer 112, the device 100 may reduce leakage current without increasing the electrical thickness of the gate stack (including the transition layer 104 and high-k dielectric layer 106). Alternatively, the use of the scavenging spacer layer 112 may allow a stable amount of leakage current but allow faster performance of the device 100, compared to a device without a scavenging spacer layer 112. Other embodiments may use intermediate values, such as increasing performance somewhat and decreasing leakage current somewhat.

FIGS. 4 through 11 are cross sectional side views that illustrate how the device 100 of FIG. 1 may be made in some embodiments.

Figure 4:
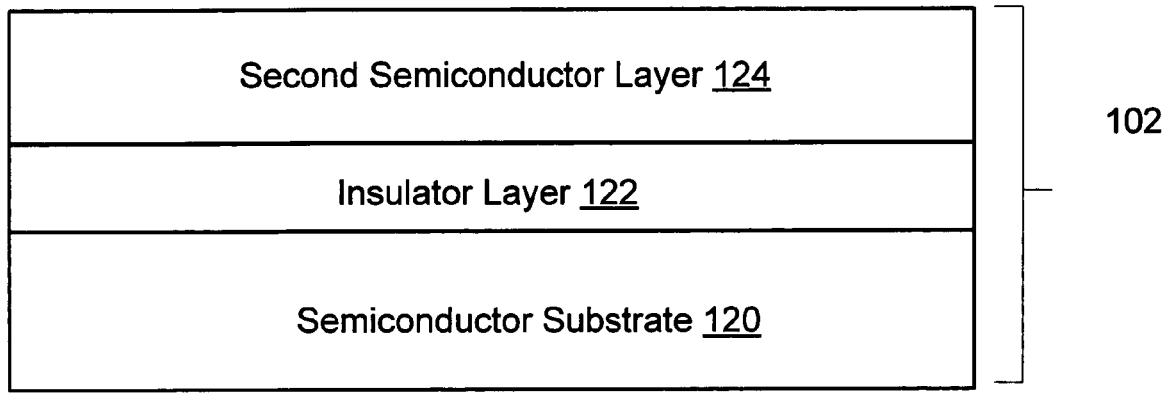
FIGS. 4 through 11 are cross sectional side views that illustrate how the device of FIG. 1 may be made in some embodiments.

FIG. 4 is a cross sectional side view that illustrates a SOI substrate 102 that may be used in the device 100. Other types of substrates 102 may be used in other embodiments. The SOI substrate 102 may include a semiconductor substrate layer 120, which may also be referred to as a first semiconductor layer 120. This semiconductor substrate 120 may comprise any suitable semiconductor material or materials, including silicon. On the semiconductor substrate 120 may be an insulating layer 122. The insulating layer 122 may comprise any suitable insulating material and may function to electrically isolate various devices formed on the substrate. In embodiments where the insulating layer 122 comprises an oxide, the insulating layer may also be referred to as a buried oxide layer. On the insulating layer 122 may be a second semiconductor layer 124. The second semiconductor layer 124 may comprise any suitable semiconductor material or materials, including silicon.

Figure 5:
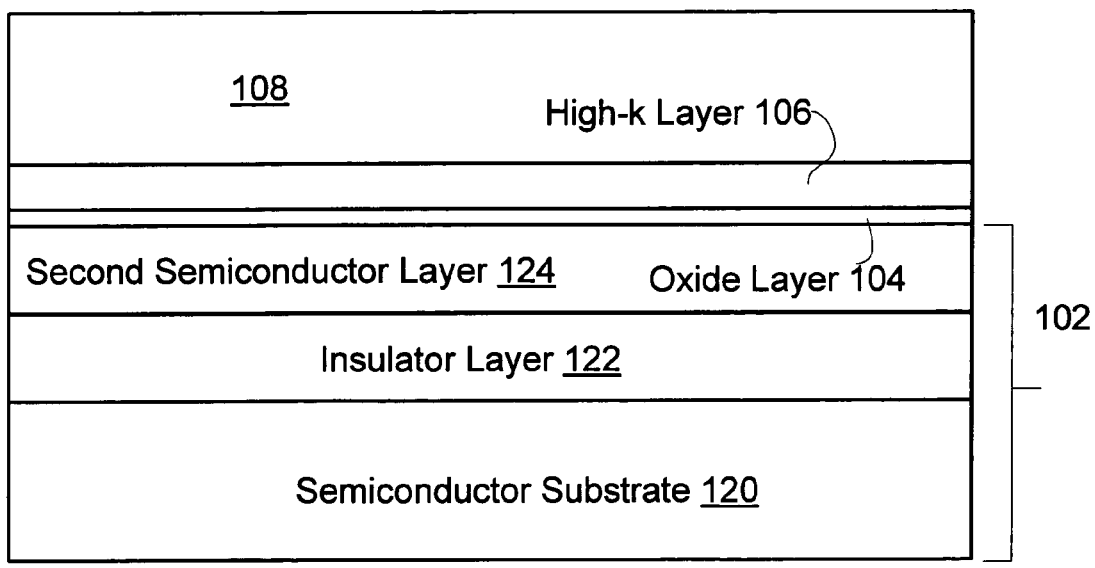

FIG. 5 is a cross sectional side view that illustrates the SOI substrate 102 after formation of a transition layer 104, high-k dielectric layer 106, and electrode layer 108 on the substrate 102, according to one embodiment of the present invention. The transition layer 104 may form on the surface of the substrate 102. As stated above, the transition layer 104 may be between about a monolayer of a material such as silicon dioxide and about three angstroms, although in other embodiments it may be thicker.

The high-k dielectric layer 106 may be deposited on the transition layer 104. In one embodiment of the present invention, high-k gate dielectric layer 106 may be formed on the substrate 102 by an atomic layer deposition ("ALD") process. In an ALD process, a growth cycle may be repeated until a high-k gate dielectric layer 106 of a desired thickness is created. Such a growth cycle may comprise the following sequence in an embodiment. Steam is introduced into a CVD ("chemical vapor deposition") reactor for a selected pulse time, followed by a purging gas. A precursor (e.g., an organometallic compound, a metal chloride or other metal halide) is then pulsed into the reactor, followed by a second purge pulse. (A carrier gas that comprises nitrogen or another inert gas may be injected into the reactor at the same time.)

While operating the reactor at a selected pressure and maintaining the substrate at a selected temperature, steam, the purging gas, and the precursor are, in turn, fed at selected flow rates into the reactor. By repeating this growth cycle—steam, purging gas, precursor, and purging gas—multiple times, one may create a high-k gate dielectric layer 106 of a desired thickness 212 on the substrate 102. The pressure at which the reactor is operated, the gases' flow rates, and the temperature at which the substrate is maintained may be varied depending upon the application and the precursor that is used. The CVD reactor may be operated long enough to form the high-k gate dielectric layer 106 with the desired thickness 212.

After forming the high-k gate dielectric layer 106 on the substrate 102, the metal or other work function layer 115 may be formed on the high-k gate dielectric layer 106. Metal work function layer 115 may be formed using conventional metal deposition processes, e.g. CVD or PVD processes, by using ALD, or another suitable method, and may comprise any conductive material from which metal gate electrodes may be derived.

The other layers (if any) of the electrode 108 may then be formed on the work function layer 115 by any suitable method. For example, the cap layer 116 may comprise silicon and may be formed by sputtering silicon at a relatively low temperature below about 500 degrees Celsius. The cap layer 116 may comprise a different material and may be formed by a different process in other embodiments. The polysilicon layer 118 may be deposited at a temperature of over 500 degrees Celsius. However, the cap layer 116 at this point may seal layers beneath the cap layer 116 from contact with oxygen, thus preventing or reducing growth in the thickness of the transition layer 104 in some embodiments.

Figure 6:
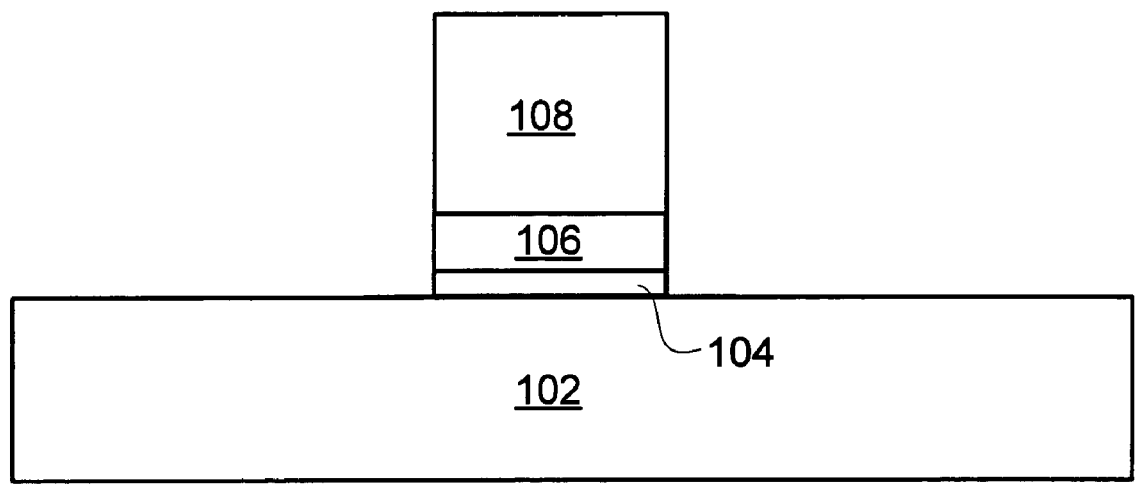

FIG. 6 is a cross sectional side view that illustrates the device 100 after the transition layer 104, high-k dielectric layer 106, and electrode 108 have been patterned to remove them from areas on which they are not desired, according to one embodiment of the present invention. Any suitable method may be used to pattern the transition layer 104, high-k dielectric layer 106, and electrode 108. For example, the portions of the layers 104, 106, 108 desired to remain in place may be protected by patterned photoresist and/or hardmask material and exposed portions of the conductive layers 104, 106, 108 removed by an etching procedure, such as a plasma-based dry etch.

Figure 7:
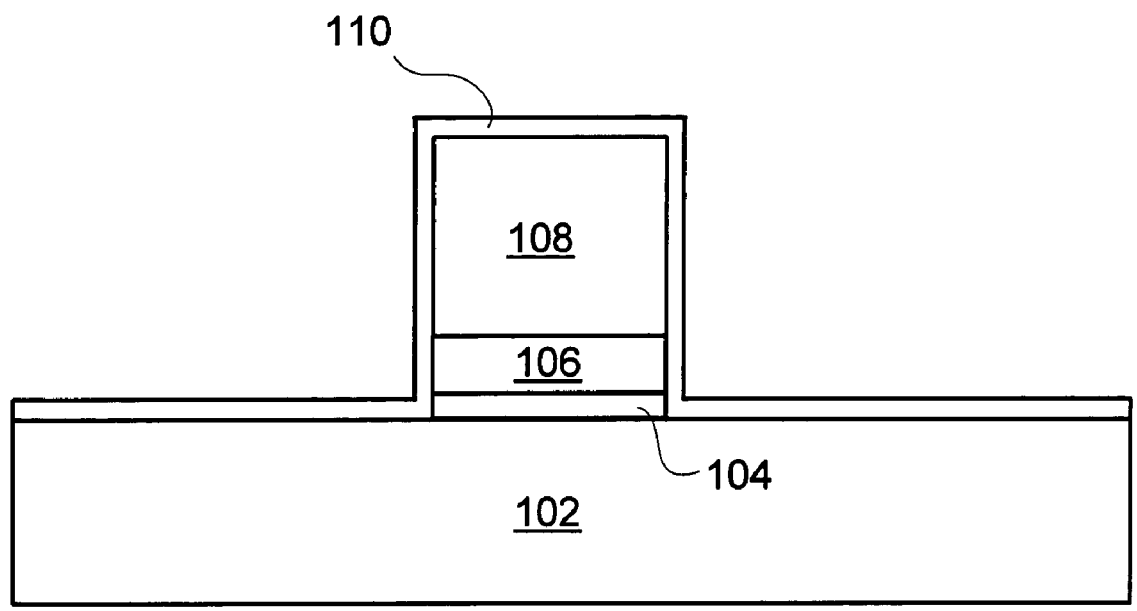

FIG. 7 is a cross sectional side view that illustrates the device 100 after formation of the inner spacer layer 110, according to one embodiment. The inner spacer layer 110 may comprise silicon nitride, silicon nitride with carbon, or other materials in other embodiments. In an embodiment, the inner spacer layer 110 may be formed by chemical vapor deposition ("CVD"), plasma-enhanced chemical vapor deposition ("PECVD"), atomic layer deposition ("ALD"), or other suitable processes. The inner spacer layer 110 may be formed at a temperature below about 500 degrees Celsius. In an embodiment, the inner spacer layer 110 may be formed at a temperature between about 300 to about 400 degrees Celsius, although other temperatures may be used in other embodiments. The inner spacer layer 110 in some embodiments may not provide a good enough seal of the layers on which it is deposited to prevent oxygen from reaching those layers.

Figure 8:
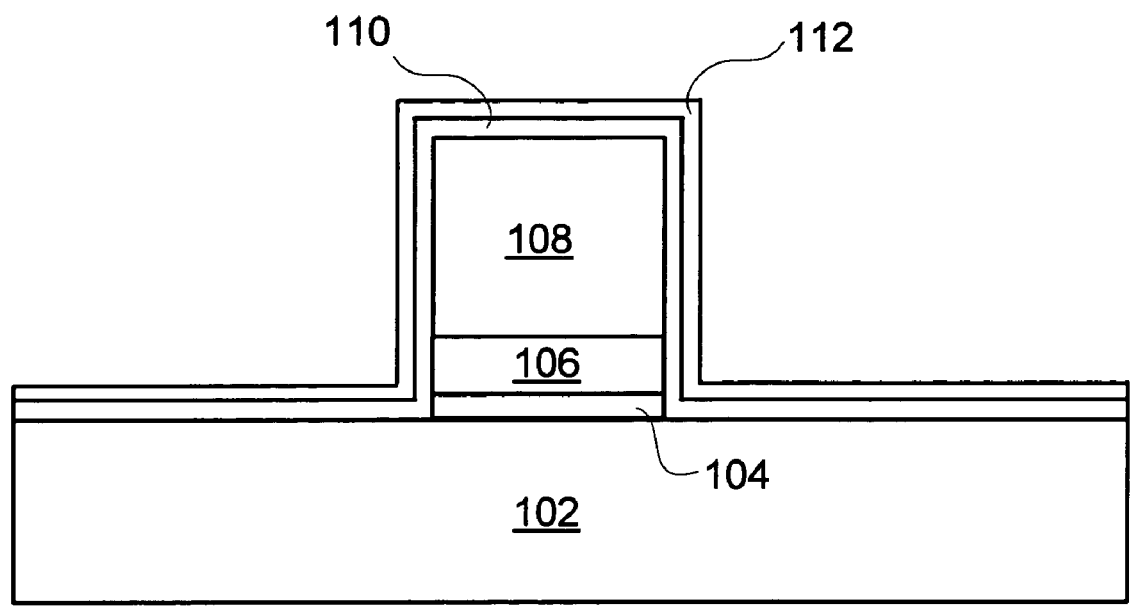

FIG. 8 is a cross sectional side view that illustrates the device 100 after formation of the scavenger spacer layer 112, according to one embodiment. The scavenger spacer layer 112 may comprise a layer of oxidizable material such as a group III, IV or V metal (e.g., Hf, Zr, Ti, Ta), aluminum, a nitride of a group III, IV or V metal (e.g., HfN, ZrN, TiN, TaN or $Ta_3N_5$), a nitride of a group III, IV or V metal that is deficient in nitrogen (e.g., $Ti_1N_{1-x}$, or $Ta_3N_{5-x}$), a silicon nitride deficient in nitrogen (e.g., $Si_3N_{4-x}$), or another material. Deficient in nitride as used herein means the material is relatively rich in the non-nitrogen element. The scavenger spacer layer 112 may be formed at a temperature below about 500 degrees Celsius. Any suitable process, depending on the material chosen for the scavenger spacer layer 112, may be used to form the scavenger spacer layer 112.

Figure 9:
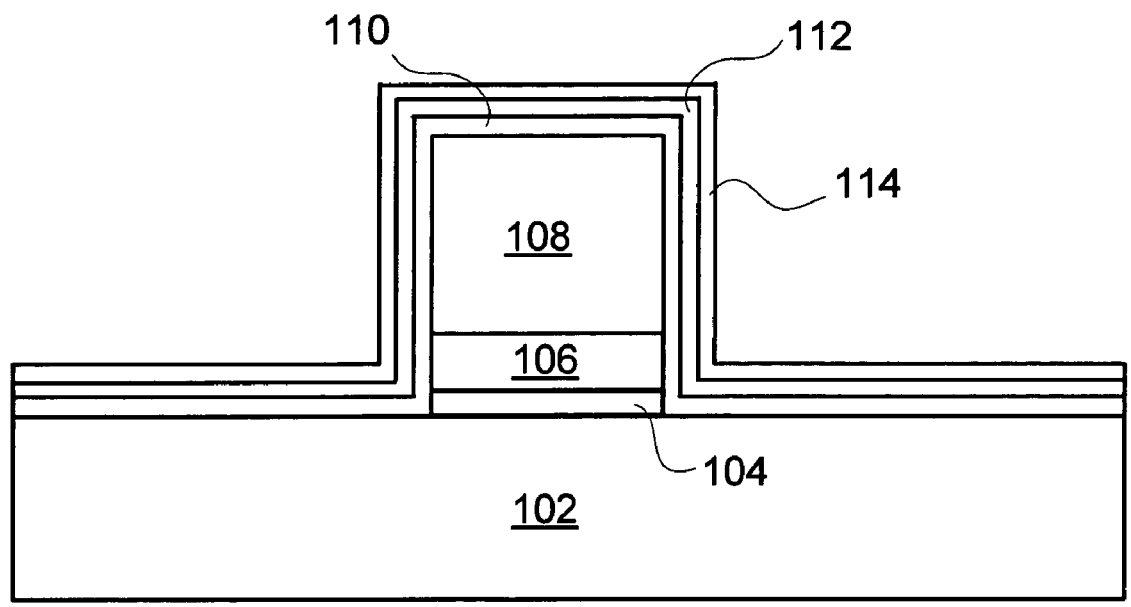

FIG. 9 is a cross sectional side view that illustrates the device 100 after formation of the outer spacer layer 114, according to one embodiment. The outer spacer layer 114 may comprise any suitable material and may be formed by any suitable process. As the scavenger spacer layer 112 is in place, the outer spacer layer 114 may be formed at high temperature (over 500 degrees Celsius). The scavenger spacer layer 112 material will react with oxygen to reduce or elimination growth in the thickness 204 of the transition layer 104.

Portions of the inner spacer layer 110, scavenger spacer layer 112, and outer spacer layer 114 may be removed to result in the device 100 as illustrated in FIG. 1. Any suitable process, such as a dry etching process, may be used to remove portions of the spacer layers 110, 112, 114 and result in the spacers 110, 112, 114.

Figure 10:
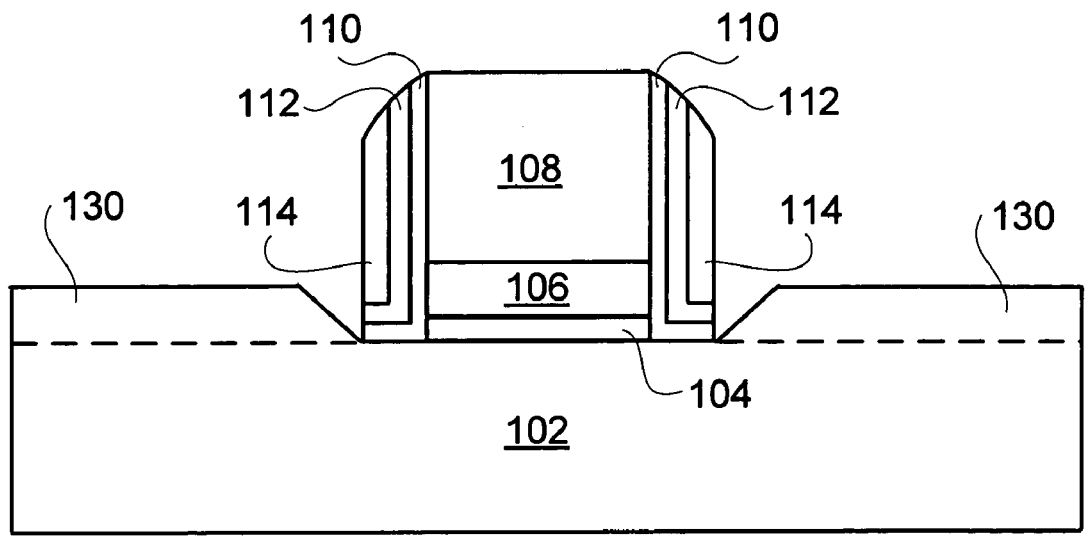

FIG. 10 is a cross sectional side view that illustrates additional regions 130 added to the substrate 102 in some embodiments. The additional regions 130 may be omitted in some embodiments. For example, when the device is a Fin-FET transistor or tri-gate transistor, there may be only a small amount of substrate on either side of the gate stack 106, 108. In such an embodiment, it may be beneficial to add material to the substrate 102 by forming the additional regions 130. In some embodiments, the additional regions 130 may be added by epitaxy. In an embodiment, the additional regions 130 may comprise the same material as the original substrate 102. The additional regions 130 may be considered portions of the substrate 102 after formation of the additional regions 130. As shown in FIG. 10, the additional regions 130 may have a height above the original substrate 102 a distance away from the spacers 110, 112, 114, but the thickness of the additional regions 130 may decrease closer to the spacers 110, 112, 114.

Figure 11:
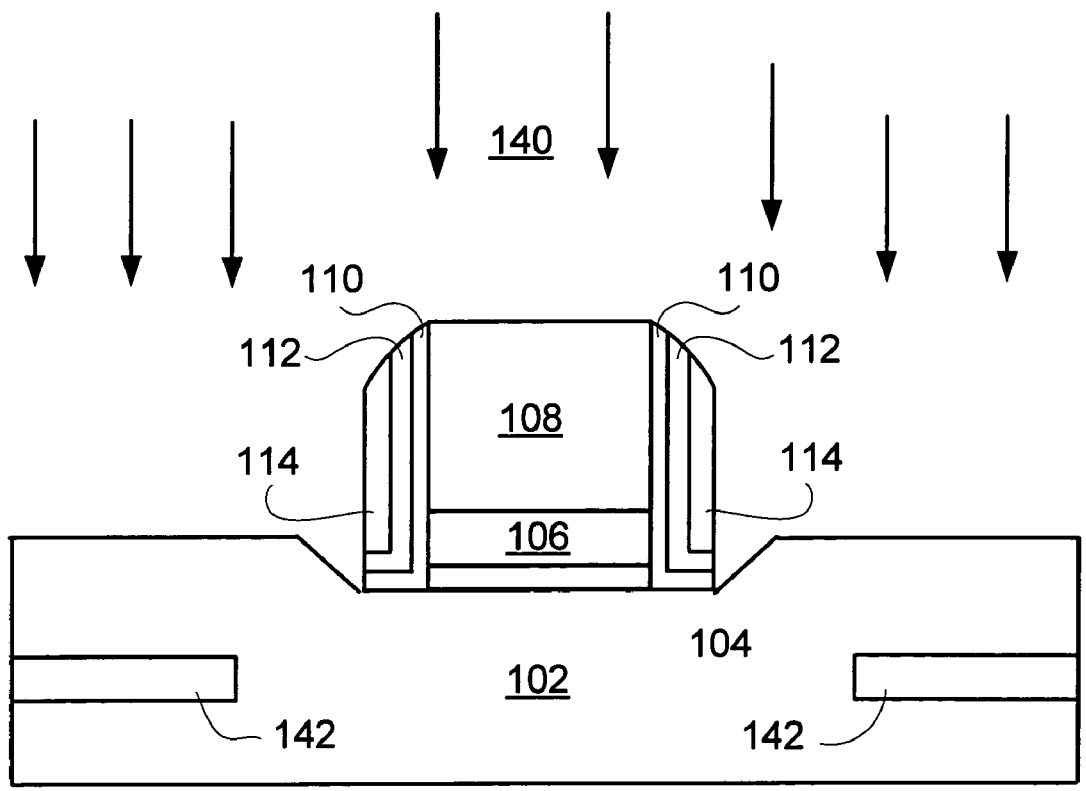

FIG. 11 is a cross sectional side view that illustrates the formation of source/drain implant regions 142 by implantation of ions 140. In the illustrated embodiment, the ions 140 are implanted into the substrate 142 to form the source/drain implanted regions 142 of the substrate 102. During ion implantation, the scavenging spacers 112 may act to react with ambient oxygen to prevent that oxygen from reaching and reacting with the substrate 102 under the gate stack 106, 108, which would result in a thicker transition layer 104. Thus, the scavenging spacers 112 may keep the transition layer 104 thinner than it would be otherwise. Other processes may also take place, such as high-temperature post-implant annealing, during which the scavenging spacers 112 may react with oxygen and keep the transition layer 104 thinner than it would be otherwise. Such a thinner transition layer 104 may allow the device 100 to have faster performance than it would with a thicker transition layer 104.

Figure 12:
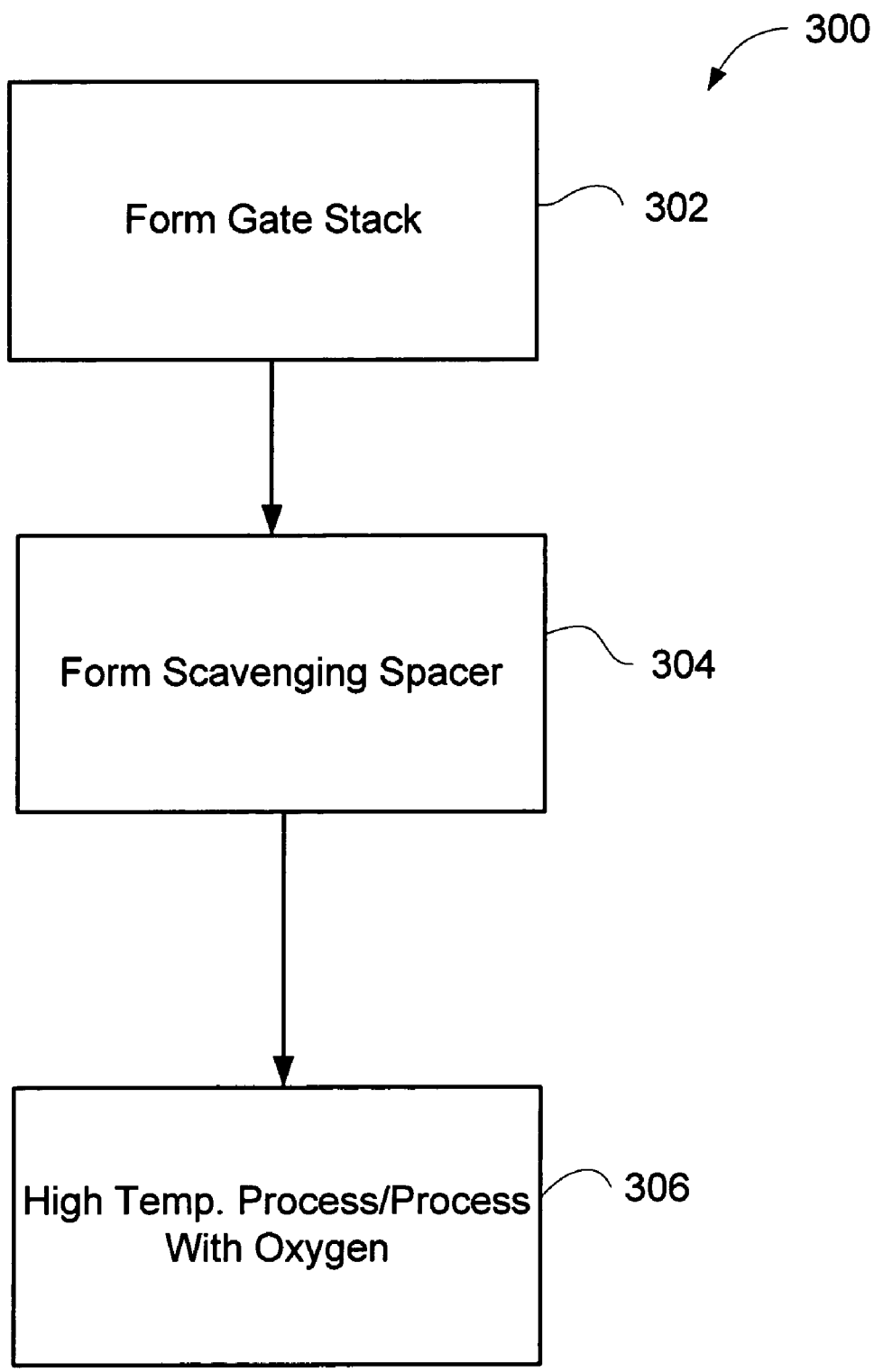
FIG. 12 is a flow chart that summarizes a method according to an embodiment of the present invention.

FIG. 12 is a flow chart 300 that summarizes a method according to an embodiment of the present invention. A gate stack of a device, such as gate stack 106, 108 shown in FIG. 1, may be formed 302. A scavenging spacer 112 may be formed 304. This scavenging spacer 112 may be reactive with oxygen to prevent oxygen from reaching a transition layer 104 beneath the gate stack 106, 108 or reduce the amount of oxygen reaching a transition layer 104 beneath the gate stack 106, 108. Processes at high temperature or processes that involve oxygen (as part of an ambient atmosphere or part of the material of a structure) may then be performed 306. These processes may include forming additional spacers, annealing processes, ion implantation, and other processes. Since the under gate region is sealed by the scavenging spacer 112, oxygen may be mostly or entirely prevented from being transported to the under gate region during these processes. Thus, reaction of oxygen with the substrate beneath the gate and formation of a thick oxide layer 104 beneath the gate may be avoided, which may prevent degradation of the performance of the device. At the end of the fabrication processes, the device 100 may have one or more layers of dielectric and interconnections above the spacers 110, 112, 114 and electrode 108.

After the device 100 has been completely formed, the material of the scavenging spacers 112 may have reacted with oxygen. The material of the scavenging spacers 112 thus may be different than it was when the scavenging spacer layer 112 was originally formed (illustrated in FIG. 8). As stated above, the scavenger spacers 112 may originally comprise a layer of oxidizable material such as a group III, IV or V metal (e.g., Hf, Zr, Ti, Ta), aluminum, a nitride of a group III, IV or V metal (e.g., HfN, ZrN, TiN, TaN or $Ta_3N_5$), a nitride of a group III, IV or V metal that is deficient in nitrogen (e.g., $Ti_1N_{1-x}$, or $Ta_3N_{5-x}$), a silicon nitride deficient in nitrogen (e.g., $Si_3N_{4-x}$), or another material. After the device 100 has been completely formed, the scavenging spacers 112 may comprise one of the above-listed materials with the addition of oxygen in varying amounts. For example, the scavenging spacers 112 may comprise an oxynitride of a group III, IV or V metal. In an embodiment where the scavenging spacer 112 originally comprises HfN, it may comprise HfON after completion of the device 100. In an embodiment where the scavenging spacer 112 originally comprises ZrN, it may comprise ZrON after completion of the device 100. In an embodiment where the scavenging spacer 112 originally comprises TiN, it may comprise TiON after completion of the device 100. In an embodiment where the scavenging spacer 112 originally comprises TaN, it may comprise TaON after completion of the device 100. In an embodiment where the scavenging spacer 112 originally comprises $Si_3N_{4-x}$, it may comprise $Si_3N_{4-x}O_{1.5x}$ after completion of the device 100. In other examples, the scavenging spacer 112 may comprise an oxidized group III, IV, or V metal, oxidized aluminum, a silicon oxynitride, or another material.

Further, after the device 100 has been completely formed, the transition layer 104 may have a thickness 204 of around three angstroms or less in an embodiment. In another embodiment, the transition layer 104 may have a thickness 204 of around four angstroms or less after the device 100 has been completely formed, although other embodiments may have a thicker transition layer 104. Absent the scavenging spacers 112, the minimum size of the transition layer 104 is significantly greater. The transition layer 104 would have a larger thickness 204 had oxygen been free to reach and react with the substrate 102, as would be the case in the absence of the scavenging spacers 112.

Figure 13:
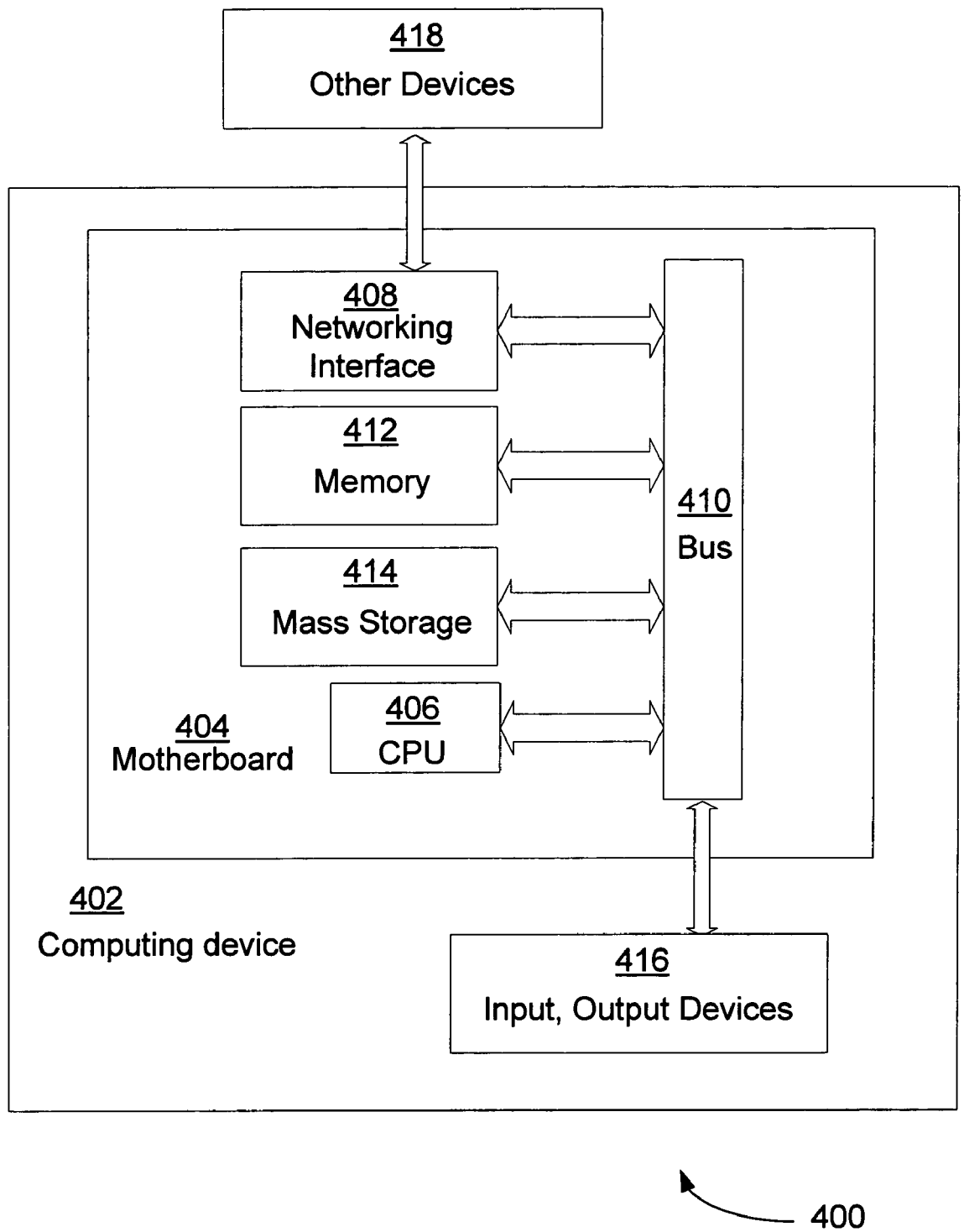
FIG. 13 illustrates a system in accordance with one embodiment of the present invention.

FIG. 13 illustrates a system 400 in accordance with one embodiment of the present invention. One or more devices 100 formed with the scavenging spacers 112 as described above may be included in the system 400 of FIG. 13. As illustrated, for the embodiment, system 400 includes a computing device 402 for processing data. Computing device 402 may include a motherboard 404. Coupled to or part of the motherboard 404 may be in particular a processor 406, and a networking interface 408 coupled to a bus 410. A chipset may form part or all of the bus 410. The processor 406, chipset, and/or other parts of the system 400 may include one or more devices 100 with scavenging spacers 112.

Depending on the applications, system 400 may include other components, including but are not limited to volatile and non-volatile memory 412, a graphics processor (integrated with the motherboard 404 or connected to the motherboard as a separate removable component such as an AGP or PCI-E graphics processor), a digital signal processor, a crypto processor, mass storage 414 (such as hard disk, compact disk (CD), digital versatile disk (DVD) and so forth), input and/or output devices 416, and so forth.

In various embodiments, system 400 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 406, 414, etc. in FIG. 13 may include one or more devices with the scavenging spacers 112 as described herein. For example, a transistor formed with the scavenging spacers 112 may be part of the CPU 406, motherboard 404, graphics processor, digital signal processor, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method for making a semiconductor device, comprising:
   providing a substrate;
   forming a transition layer on the substrate;
   forming a high-k gate dielectric layer on the transition layer;
   forming a metal work function layer on the high-k gate dielectric layer;
   forming an oxygen scavenging spacer layer on side walls of the transition layer, the high-k gate dielectric layer, and the metal work function layer, the oxygen scavenging spacer layer comprising oxidizable material; and
   entirely oxidizing the oxygen scavenging spacer layer.

2. The method of claim 1, further comprising forming an inner spacer layer on side walls of the high-k gate dielectric layer, between the oxygen scavenging spacer layer and the side walls of the high-k gate dielectric layer.

3. The method of claim 2, wherein formation of the inner spacer layer occurs at a temperature at about 400 degrees Celsius or below.

4. The method of claim 3, further comprising forming an outer spacer layer on side walls of the high-k gate dielectric layer, so that the oxygen scavenging layer is between the outer spacer layer and the side walls of the high-k gate dielectric layer.

5. The method of claim 1, further comprising forming an outer spacer layer on side walls of the high-k gate dielectric layer, so that the oxygen scavenging spacer layer is between the outer spacer layer and the side walls of the high-k gate dielectric layer.

6. The method of claim 1, wherein the oxygen scavenging spacer layer comprises a material selected from the group consisting of a Group III metal, a group IV metal, a group V metal, and aluminum.

7. The method of claim 1, wherein the oxygen scavenging spacer layer comprises a material selected from the group consisting of a nitride of a group III, IV or V metal.

8. The method of claim 1, wherein the oxygen scavenging spacer layer comprises a material selected from the group consisting of a nitride of a group III, IV or V metal that is deficient in nitrogen, and a silicon nitride deficient in nitrogen.

* * * * *